United States Patent
Niakan et al.

(10) Patent No.: US 11,336,006 B2
(45) Date of Patent: May 17, 2022

(54) ISOLATING ANTENNA ARRAY COMPONENT

(71) Applicant: Microsoft Technology Licensing, LLC, Redmond, WA (US)

(72) Inventors: Nahal Niakan, Issaquah, WA (US); Sean Russell Mercer, Issaquah, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 16 days.

(21) Appl. No.: 16/658,810

(22) Filed: Oct. 21, 2019

(65) Prior Publication Data

US 2021/0119331 A1 Apr. 22, 2021

(51) Int. Cl.
*H01Q 1/24* (2006.01)
*H01Q 1/52* (2006.01)
*H04B 1/40* (2015.01)

(52) U.S. Cl.
CPC .............. *H01Q 1/523* (2013.01); *H04B 1/40* (2013.01)

(58) Field of Classification Search
CPC ...... H01Q 1/523; H01Q 1/243; H01Q 21/065; H01Q 21/28; H01Q 1/38; H01Q 1/2266;
(Continued)

(56) References Cited

U.S. PATENT DOCUMENTS 7,557,761 B2    7/2009 Iwai et al.
7,830,312 B2    11/2010 Choudhury et al.
(Continued)

FOREIGN PATENT DOCUMENTS

CN    106785423 A    5/2017
CN    106848603 A    6/2017
(Continued)

OTHER PUBLICATIONS

"https://web.archive.org/web/20190906122839/https://www.qualcomm.com/media/documents/files/latest-qtm052-mmwave-antenna-module-photo.jpg", Retrieved from https://web.archive.org/web/20190906122839/https://www.qualcomm.com/media/documents/files/latest-qtm052-mmwave-antenna-module-photo.jpg, Sep. 6, 2019, 1 Page.

(Continued)

*Primary Examiner* — David E Lotter
(74) *Attorney, Agent, or Firm* — Holzer Patel Drennan

(57) ABSTRACT

A communication device includes two antennas operational within a first frequency range in the communication device. An integrated isolating antenna array component is positioned between the two antennas in the communication device to reduce radiofrequency coupling between the two antennas. The integrated isolating antenna array component includes an interconnection substrate and an antenna array adjacent to the interconnection substrate and including one or more radiating elements. The antenna array is configured to drive the one or more radiating elements within a second frequency range in the communication device. The second frequency range is higher than the first frequency range. The integrated isolating antenna array component also includes an isolator affixed to the interconnection substrate and configured to be connected to electrical ground. The isolator is configured to reduce the radiofrequency coupling between the two antennas within the first frequency range.

20 Claims, 8 Drawing Sheets

(58) Field of Classification Search
CPC ........ H01Q 9/0407; H01Q 1/24; H01Q 1/242; H04B 1/40
See application file for complete search history.

(56) References Cited

U.S. PATENT DOCUMENTS

| | | | |
|---|---|---|---|
| 8,854,266 | B2 | 10/2014 | Zhu et al. |
| 9,768,499 | B1 | 9/2017 | Clark et al. |
| 9,831,553 | B2 | 11/2017 | Liu et al. |
| 2011/0014959 | A1 | 1/2011 | Tassoudji et al. |
| 2013/0050031 | A1* | 2/2013 | Zhu ........................ H01Q 1/523 343/702 |
| 2016/0308563 | A1* | 10/2016 | Ouyang ............... H01Q 1/2283 |
| 2017/0264012 | A1* | 9/2017 | Clark ..................... H01Q 21/08 |
| 2018/0074173 | A1 | 3/2018 | Trotta et al. |
| 2018/0083367 | A1* | 3/2018 | Song ...................... H01Q 1/521 |
| 2018/0166763 | A1 | 6/2018 | Cruickshank et al. |
| 2018/0219272 | A1 | 8/2018 | Baheti et al. |
| 2019/0103682 | A1* | 4/2019 | Thai ......................... H01Q 1/38 |
| 2019/0252771 | A1* | 8/2019 | Yong .................... H01Q 21/065 |
| 2019/0312347 | A1* | 10/2019 | Edwards ............. H01Q 9/0435 |
| 2020/0021019 | A1* | 1/2020 | Rajagopalan ........ H01Q 9/0414 |
| 2020/0052403 | A1* | 2/2020 | Hong ..................... H01Q 21/24 |
| 2020/0106185 | A1* | 4/2020 | Paulotto ............... H01Q 1/2283 |

FOREIGN PATENT DOCUMENTS

| | | |
|---|---|---|
| CN | 108448239 A | 8/2018 |
| WO | 2018125242 A1 | 7/2018 |
| WO | 2018214427 A1 | 11/2018 |

OTHER PUBLICATIONS

"QTM052 mmWave Antenna Modules", Retrieved from https://web.archive.org/web/20180726234517/https://www.qualcomm.com/products/qtm052-mmwave-antenna-modules, Jul. 26, 2018, 4 Pages.
"Qualcomm Announces the Latest and Smallest Additions in its Family of 5G Nr mmWave Antenna Modules", Retrieved from https://www.qualcomm.com/news/releases/2018/10/22/qualcomm-announces-latest-and-smallest-additions-its-family-5g-nr-mmwave, Oct. 22, 2018, 3 Pages.
"Samsung Galaxy Note10+ 5G Teardown", https://web.archive.org/web/20190921084407/https://www.ifixit.com/Teardown/Samsung+Galaxy+Note10++5G+Teardown/125590, Aug. 21, 2019, 12 Pages.
"International Search Report and Written Opinion issued in PCT Application No. PCT/US2020/056642", dated Feb. 2, 2021, 24 Pages.

* cited by examiner

ISOLATING ANTENNA ARRAY COMPONENT

BACKGROUND

Available volume for antennas in communication devices continues to decrease under pressure from industrial design and other considerations. As available volume decreases, the distance separating two antennas in a similar frequency range (2.4 GHz) also shrinks, introducing an increased risk of coupling between the two antennas and therefore reduced antenna performance. Isolators can be used to decrease the coupling between the two antennas, but isolators also occupy precious volume within the communication device.

SUMMARY

The described technology provides a communication device including two antennas operational within a first frequency range in the communication device. An integrated isolating antenna array component is positioned between the two antennas in the communication device to reduce radiofrequency coupling between the two antennas. The integrated isolating antenna array component includes an interconnection substrate and an antenna array adjacent to the interconnection substrate and including one or more radiating elements. The antenna array is configured to drive the one or more radiating elements within a second frequency range in the communication device. The second frequency range is higher than the first frequency range. The integrated isolating antenna array component also includes an isolator affixed to the interconnection substrate and configured to be connected to electrical ground. The isolator is configured to reduce the radiofrequency coupling between the two antennas within the first frequency range.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Figure 1:
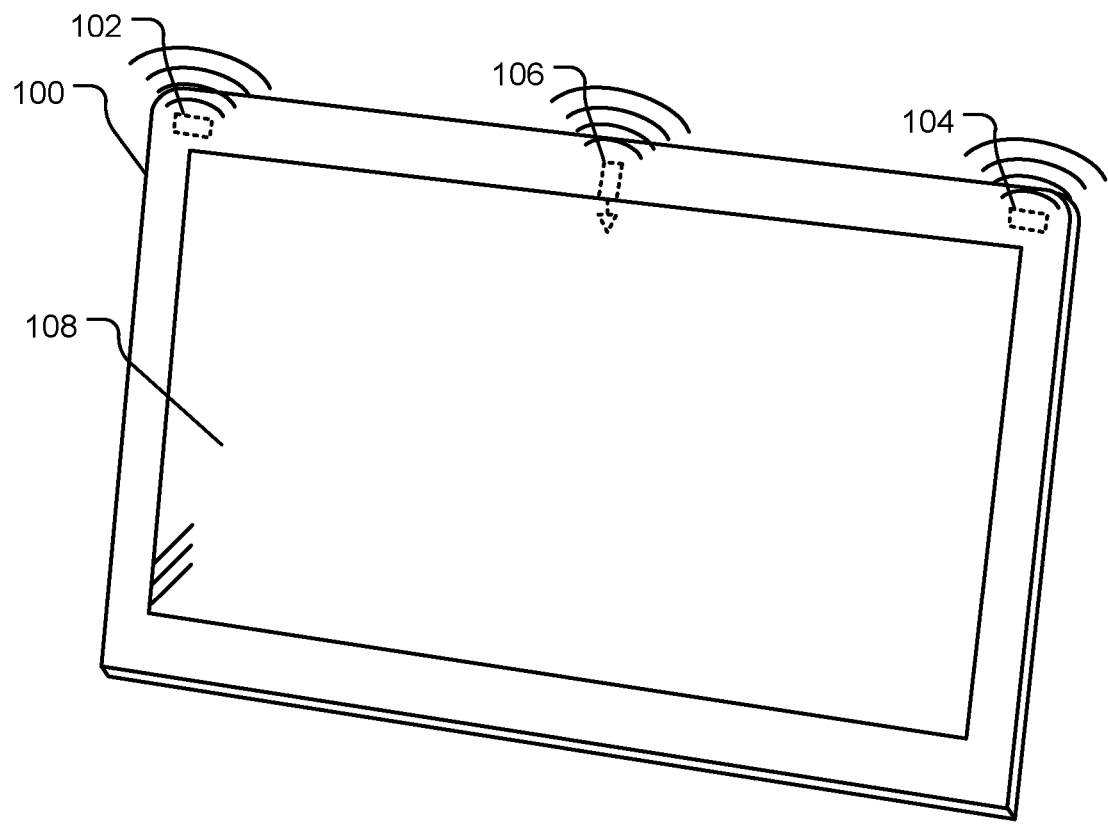
FIG. 1 illustrates an example communication device including two antennas and an isolating antenna array component.

FIG. 1 illustrates an example communication device 100 including two antennas 102 and 104 and an isolating antenna array component 106. The antennas 102 and 104, and the isolating antenna array component 106 are positioned in the bezel area of the communication device 100, between a display 108 and an edge of the communication device 100. In many implementations, the design of the bezel area and the overall size of such communication devices continue to shrink in light of industrial design and other considerations.

The antenna 102 and the antenna 104 are each driven to radiate in a first radiofrequency (RF) range (e.g., 1700 MHz-5 GHz). In contrast, the isolating antenna array component 106 is driven to radiate in a second RF range (e.g., >6 GHz).

The size of the communication device 100 and the operational characteristics of the first frequency range can introduce coupling between the antennas 102 and 104. Accordingly, the isolating antenna array component 106 includes an isolator structure integrated into the isolating antenna array component 106 such that the geometry and placement of the isolator decreases coupling between the antennas 102 and 104 in their operational frequency range (e.g., by moving a radiofrequency null of one antenna to coincide with the position of the other antenna and/or by canceling edge currents along a ground plane between the two antennas). As shown, the isolator of the isolating antenna array component 106 is electrically grounded.

Figure 2:
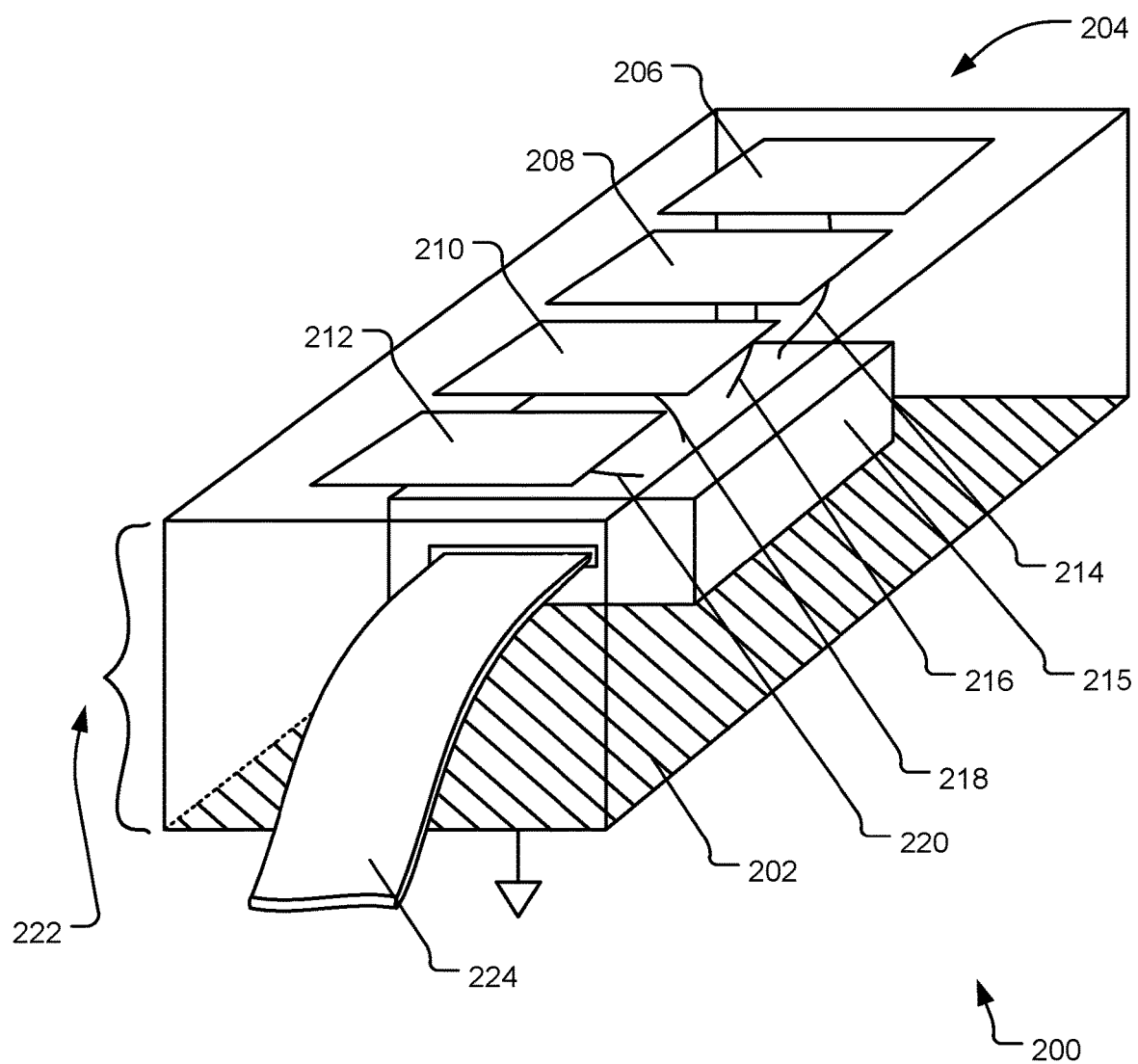
FIG. 2 illustrates a perspective view of an example isolating antenna array component with an isolator separated from an antenna array.

FIG. 2 illustrates a perspective view of an example isolating antenna array component 200 with an isolator 202 separated from an antenna array 204. The antenna array 204 includes multiple radiating elements 206, 208, 210, and 212, the type, size, number, and placement of which may vary according to design objectives. In at least one implementation, an antenna array may include only a single radiating element. In various implementations, the individual antenna elements may be various combinations of dipole antennas, patch antennas, and slot antennas, although other antenna types may also be used. The isolator 202 includes a highly conductive material (shown with hash lines) and is configured to be connected to electrical ground (e.g., the isolator 202 may include a ground connection or terminal).

The multiple radiating elements 206, 208, 210, and 212 are driven by transceiver circuitry 215 via conductive interconnects 214, 216, 218, and 220 (e.g., antenna feeds) routed through an interconnection substrate 222. In at least one implementation, transceiver circuitry may drive only a single radiating element (such as via a single conductive interconnect). In various implementations, the radiating elements 206, 208, 210, and 212 may be driven via a direct electrical feed connection or via capacitive coupling (e.g., parasitic feeding). In the illustrated implementation, the interconnection substrate 222 is positioned adjacent to the isolator 202 and the antenna array 204, wherein the interconnection substrate 222 may include intermediate layers between, for example, a multi-layer interconnection structure and the isolator 202 and/or the antenna array 204.

In one implementation, the transceiver circuitry 215 is embedded in the interconnection substrate 222 and includes a transceiver element for each radiating element. An example transceiver element may include a phase shifter, transmitting channel (e.g., including a transmitting amplifier and a transmitting mixer), and a receiving channel (e.g., including a receiving amplifier and a receiving mixer), although other configurations are contemplated. The carrier signal communicated through the multiple radiating elements 206, 208, 210, and 212 are received in the transmitting channel in an intermediate frequency (IF) and increased to a high frequency (e.g., 20 GHz-100 GHz) for driving the antenna array 204 to radiate (e.g., in mmWave radio solutions). The transceiver circuitry 215 may be connected to ground, power, and digital control logic through a connector 224, although in other implementations, the transceiver circuitry 215 may be connected to electrical ground through the grounded isolator 202.

Figure 3:
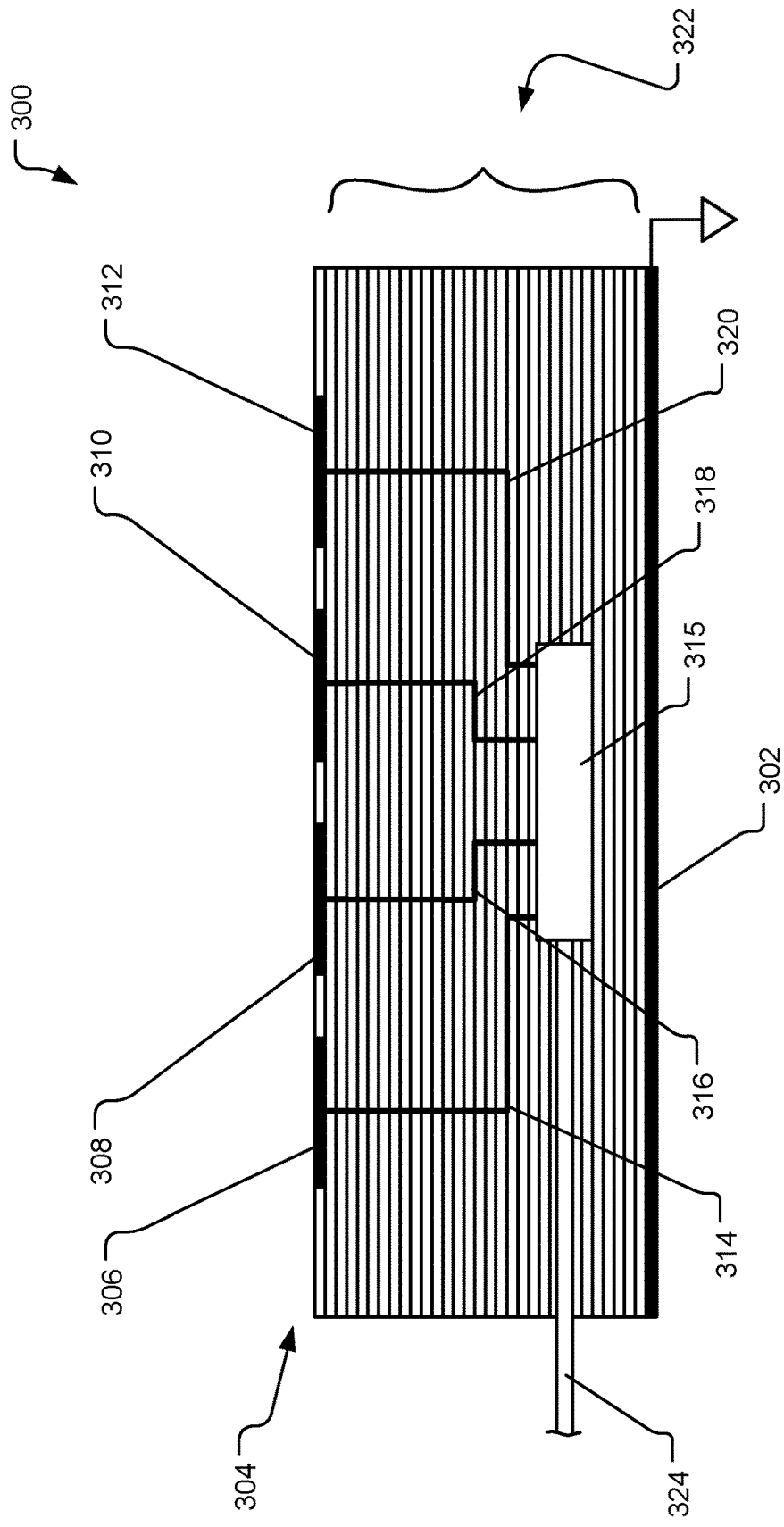
FIG. 3 illustrates a cross-sectional view of an example isolating antenna array component with an isolator separated from an antenna array.

FIG. 3 illustrates a cross-sectional view of an example isolating antenna array component 300 with an isolator 302 separated from an antenna array 304. The antenna array 304 includes multiple radiating elements 306, 308, 310, and 312, the type, size, number, and placement of which may vary according to design objectives. In at least one implementation, an antenna array may include only a single radiating element. In various implementations, the individual antenna elements may be various combinations of dipole antennas, patch antennas, and slot antennas, although other antenna types may also be used. The isolator 302 includes a highly conductive material and is configured to be connected to electrical ground (e.g., the isolator 302 may include a ground connection or terminal).

The multiple radiating elements 306, 308, 310, and 312 are driven by transceiver circuitry 315 via conductive interconnects 314, 316, 318, and 320 (e.g., antenna feeds) routed through an interconnection substrate 322. In at least one implementation, transceiver circuitry may drive only a single radiating element (such as via a single conductive interconnect). In various implementations, the radiating elements 306, 308, 310, and 312 may be driven via a direct electrical feed connection or via capacitive coupling (e.g., parasitic feeding). In the illustrated implementation, the interconnection substrate 322 is positioned adjacent to the isolator 302 and the antenna array 304, wherein the interconnection substrate 322 may include intermediate layers between, for example, a multi-layer interconnection structure and the isolator 302 and/or the antenna array 304.

In one implementation, the interconnection substrate 322 is formed as a multilayer substrate, such as a multi-layer low-temperature co-fired ceramic substrate or a multi-layer RF substrate, although other interconnection substrates may be employed. Each conductive interconnect 314, 316, 318, and 320 is connected or coupled to transceiver circuitry 315 for a corresponding radiating element of the antenna array 304.

In one implementation, the transceiver circuitry 315 is embedded in the interconnection substrate 322 and includes a transceiver element for each radiating element. An example transceiver element may include a phase shifter, transmitting channel (e.g., including a transmitting amplifier and a transmitting mixer), and a receiving channel (e.g., including a receiving amplifier and a receiving mixer), although other configurations are contemplated. The carrier signal communicated through the multiple radiating elements 306, 308, 310, and 312 is received in the transmitting channel in an intermediate frequency (IF) and increased to a high frequency (e.g., 25 GHz-100 GHz) for driving the antenna array 304 to radiate (e.g., in mmWave radio solutions). The transceiver circuitry 315 may be connected to ground, power, and digital control logic through a connector 324, although in other implementations, the transceiver circuitry 315 may be connected to electrical ground through the grounded isolator 302.

Figure 4:
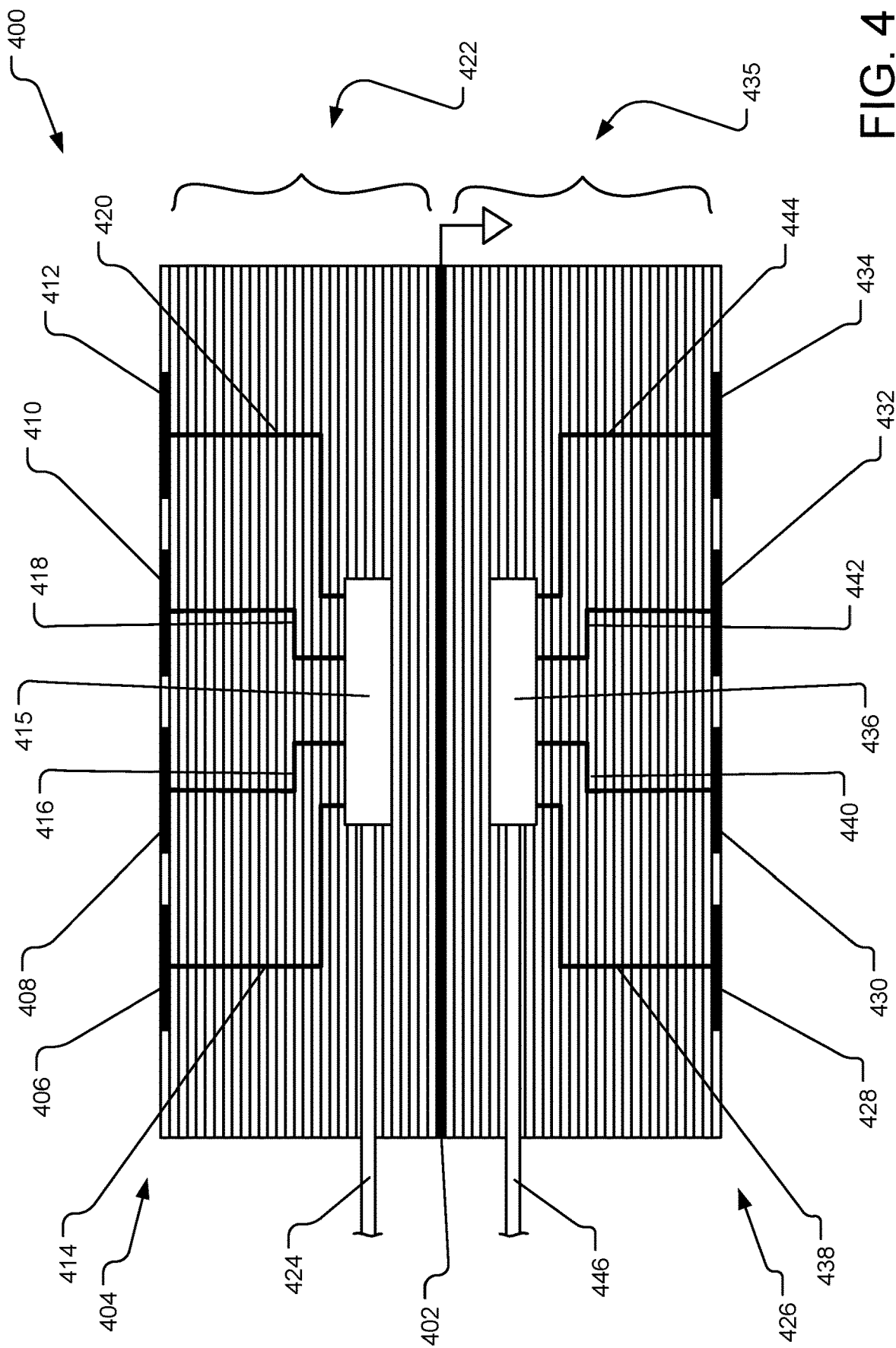
FIG. 4 illustrates a cross-sectional view of an example isolating antenna array component with an isolator separated from two different antenna arrays.

FIG. 4 illustrates a cross-sectional view of an example isolating antenna array component 400 with an isolator 402 separated from two different antenna arrays 404 and 426. The antenna array 404 includes multiple radiating elements 406, 408, 410, and 412, the type, size, number, and placement of which may vary according to design objectives. In at least one implementation, an antenna array may include only a single radiating element. In various implementations, the individual antenna elements may be various combinations of dipole antennas, patch antennas, and slot antennas, although other antenna types may also be used. The isolator 402 includes a highly conductive material and is configured to be connected to electrical ground (e.g., the isolator 402 may include a ground connection or terminal).

The multiple radiating elements 406, 408, 410, and 412 are driven by transceiver circuitry 415 via conductive interconnects 414, 416, 418, and 420 (e.g., antenna feeds) routed through an interconnection substrate 422. In at least one implementation, transceiver circuitry may drive only a single radiating element (such as via a single conductive interconnect). In various implementations, the radiating elements 406, 408, 410, and 412 may be driven via a direct electrical feed connection or via capacitive coupling (e.g., parasitic feeding). In the illustrated implementation, the interconnection substrate 422 is positioned adjacent to the isolator 402 and the antenna array 404, wherein the interconnection substrate 422 may include intermediate layers between, for example, a multi-layer interconnection structure and the isolator 402 and/or the antenna array 404.

In one implementation, the interconnection substrate 422 is formed as a multilayer substrate, such as a multi-layer low-temperature co-fired ceramic substrate or a multi-layer RF substrate, although other interconnection substrates may be employed. Each conductive interconnect 414, 416, 418, and 420 is connected to transceiver circuitry for a corresponding radiating element of the antenna array 404.

In one implementation, the transceiver circuitry 415 is embedded in the interconnection substrate 422 and includes a transceiver element for each radiating element. An example transceiver element may include a phase shifter, transmitting channel (e.g., including a transmitting amplifier and a transmitting mixer), and a receiving channel (e.g., including a receiving amplifier and a receiving mixer), although other configurations are contemplated. The carrier signal communicated through the multiple radiating elements 406, 408, 410, and 412 are received in the transmitting channel in an intermediate frequency (IF) and increased to a high frequency (e.g., 25 GHz-100 GHz) for driving the antenna array 404 to radiate (e.g., in mmWave radio solutions). The transceiver circuitry 415 may be connected to ground, power, and digital control logic through a connector 424, although in other implementations, the transceiver circuitry 415 may be connected to electrical ground through the grounded isolator 402.

The other antenna array 426 is positioned on the opposite side of the isolator 402 relative to the antenna array 404. The other antenna array 426 includes multiple radiating elements 428, 430, 432, and 434, which are connected through another interconnection substrate 435 to other transceiver circuitry 436 via conductive interconnects 438, 440, 442, and 444 (e.g., antenna feeds). In at least one implementation, an antenna array may include only a single radiating element. In various implementations, the radiating elements 428, 430, 432, and 434 may be driven via a direct electrical feed connection or via capacitive coupling (e.g., parasitic feeding). In the illustrated implementation, the interconnection substrate 435 is positioned adjacent to the isolator 402 and the antenna array 426, wherein the interconnection substrate 435 may include intermediate layers between, for example, a multi-layer interconnection structure and the isolator 402 and/or the antenna array 426.

The transceiver circuitry 436 is embedded in the interconnection substrate 435 and may be connected to ground, power, and digital control logic through a connector 446, although in other implementations, the transceiver circuitry 436 may be connected to electrical ground through the grounded isolator 402. In one implementation, the transceiver circuitry 436 includes a transceiver element for each radiating element. An example transceiver element may include a phase shifter, transmitting channel (e.g., including a transmitting amplifier and a transmitting mixer), and a receiving channel (e.g., including a receiving amplifier and a receiving mixer), although other configurations are contemplated.

Figure 5:
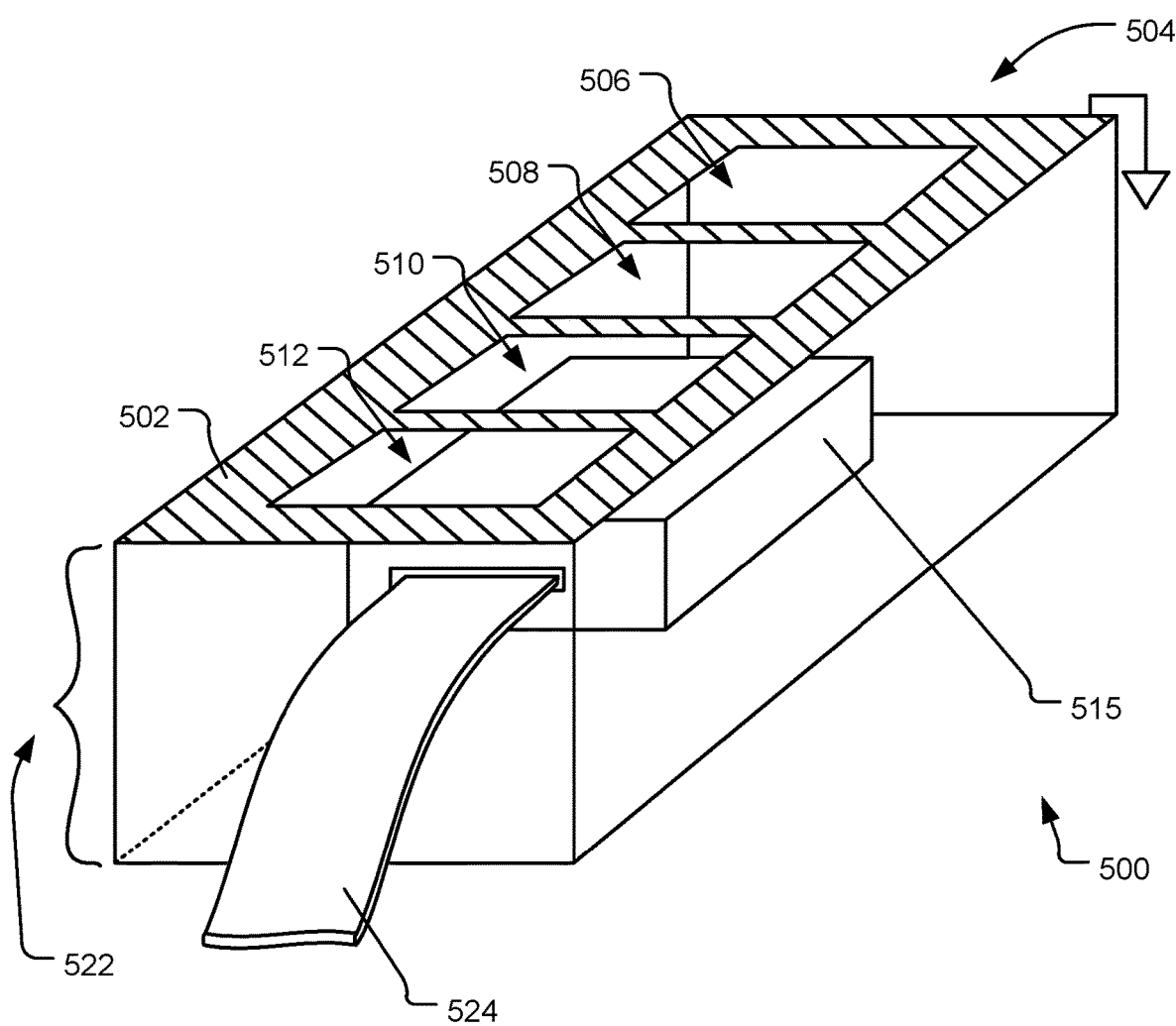
FIG. 5 illustrates a perspective view of an example isolating antenna array component with an antenna array formed in an isolator.

FIG. 5 illustrates a perspective view of an example isolating antenna array component 500 with an antenna array 504 formed in an isolator 502. The antenna array 504 includes four slot antennas (e.g., radiating elements 506, 508, 510, and 512) formed as apertures in the isolator 502, although the number, placement, size, and shape of the apertures may vary according to design objectives. In at least one implementation, an antenna array may include only a single radiating element. The isolator 502 includes a highly conductive material (shown with hash lines) and is configured to be connected to electrical ground (e.g., the isolator 502 may include a ground connection or terminal).

The multiple radiating elements 506, 508, 510, and 512 are driven by transceiver circuitry 515 via conductive interconnects (e.g., antenna feeds—not shown) routed through an interconnection substrate 222. In at least one implementation, transceiver circuitry may drive only a single radiating element (such as via a single conductive interconnect). In the illustrated implementation, the interconnection substrate 522 is positioned adjacent to the isolator 502 and the antenna array 504, wherein the interconnection substrate 522 may include intermediate layers between, for example, a multi-layer interconnection structure and the isolator 502 and/or the antenna array 504.

In one implementation, the transceiver circuitry 515 is embedded in the interconnection substrate 522 and includes a transceiver element for each radiating element. An example transceiver element may include a phase shifter, transmitting channel (e.g., including a transmitting amplifier and a transmitting mixer), and a receiving channel (e.g., including a receiving amplifier and a receiving mixer), although other configurations are contemplated. In one implementation, each conductive interconnect couples the phase shifter, transmitting channel, and receiving channel to its corresponding radiating element (e.g., to drive the slot antenna via capacitive coupling).

The carrier signal communicated through the multiple radiating elements 506, 508, 510, and 512 is received in the transmitting channel in an intermediate frequency (IF) and increased to a high frequency (e.g., 25 GHz-100 GHz) for driving the antenna array 504 to radiate (e.g., in mmWave radio solutions). The transceiver circuitry 515 may be connected to ground, power, and digital control logic through a connector 524, although in other implementations, the transceiver circuitry 515 may be connected to electrical ground through the grounded isolator 502.

Figure 6:
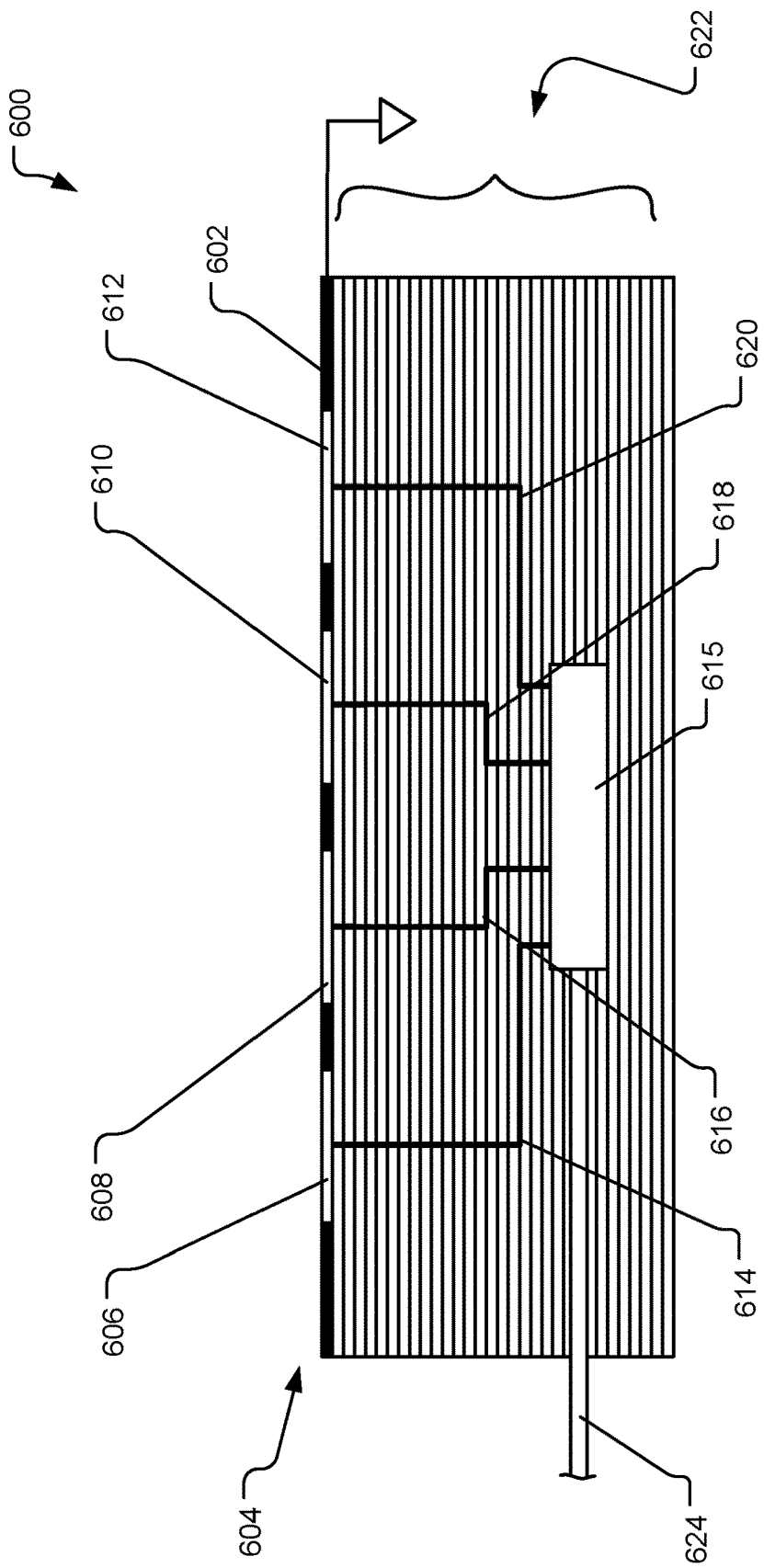
FIG. 6 illustrates a cross-sectional view of an example isolating antenna array component with an antenna array formed in an isolator.

FIG. 6 illustrates a cross-sectional view of an example isolating antenna array component 600 with an antenna array 604 formed in an isolator 602. The antenna array 604 includes four slot antennas (e.g., radiating elements 606, 608, 610, and 612) formed as apertures in the isolator 602, although the number, placement, size, and shape of the apertures may vary according to design objectives. In at least one implementation, an antenna array may include only a single radiating element. The isolator 602 includes a highly conductive material (shown with hash lines) and is configured to be connected to electrical ground (e.g., the isolator 602 may include a ground connection or terminal).

The multiple radiating elements 606, 608, 610, and 612 are driven by transceiver circuitry 615 via conductive interconnects 614, 616, 618, and 620 (e.g., antenna feeds) routed through an interconnection substrate 622. In at least one implementation, transceiver circuitry may drive only a single radiating element (such as via a single conductive interconnect). In the illustrated implementation, the interconnection substrate 622 is positioned adjacent to the isolator 602 and the antenna array 604, wherein the interconnection substrate 622 may include intermediate layers between, for example, a multi-layer interconnection structure and the isolator 602 and/or the antenna array 604.

In one implementation, the interconnection substrate 622 is formed as a multilayer substrate, such as a multi-layer low-temperature co-fired ceramic substrate or a multi-layer RF substrate, although other interconnection substrates may be employed. Each conductive interconnect 614, 616, 618, and 620 is connected or coupled to transceiver circuitry 615 for a corresponding radiating element of the antenna array 604.

In one implementation, the transceiver circuitry 615 is embedded in the interconnection substrate 622 and includes a transceiver element for each radiating element. An example transceiver element may include a phase shifter, transmitting channel (e.g., including a transmitting amplifier and a transmitting mixer), and a receiving channel (e.g., including a receiving amplifier and a receiving mixer), although other configurations are contemplated. In one implementation, each conductive interconnect couples the phase shifter, transmitting channel, and receiving channel to its corresponding radiating element (e.g., to drive the slot antenna via capacitive coupling).

The carrier signal communicated through the multiple radiating elements 606, 608, 610, and 612 is received in the transmitting channel in an intermediate frequency (IF) and increased to a high frequency (e.g., 25 GHz-100 GHz) for driving the antenna array 604 to radiate (e.g., in mmWave radio solutions). The transceiver circuitry 615 may be connected to ground, power, and digital control logic through a connector 624, although in other implementations, the transceiver circuitry 615 may be connected to ground through the grounded isolator 602.

Figure 7:
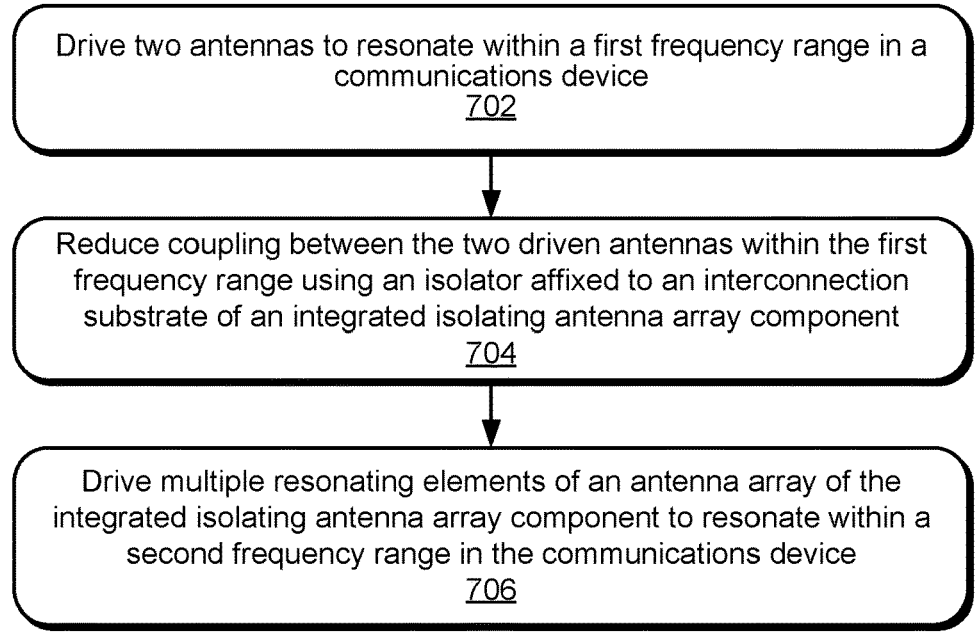
FIG. 7 illustrates example operations for reducing coupling between two antennas using an isolating antenna array component.

FIG. 7 illustrates example operations 700 for reducing coupling between two antennas using an isolating antenna array component. A driving operation 702 drives two antennas to radiate within a first frequency range (e.g., 2.4 GHz) in a communication device (such as from transceiver circuitry via conductive interconnects). While driving the two antennas, an isolation operation 704 reduces radiofrequency coupling between the two driven antennas within the first frequency range using an isolator affixed to an interconnection substrate of an integrated isolating antenna array component in the communication device (e.g., by moving a radiofrequency null of one antenna to coincide with the position of the other antenna and/or by canceling edge currents along a ground plane between the two antennas). Another driving operation 706 drives multiple radiating elements on an antenna array of the integrated isolating antenna array component to radiate within a second RF range (e.g., 25 GHz-100 GHz) in the communication device, wherein the second RF range is higher than the first frequency range. In at least one implementation, an antenna array may include only a single radiating element. In at least one implementation, transceiver circuitry may drive only a single radiating element (such as via a single conductive interconnect).

Example isolating antenna array components that can be operated by this example method are disclosed and suggested herein.

Figure 8:
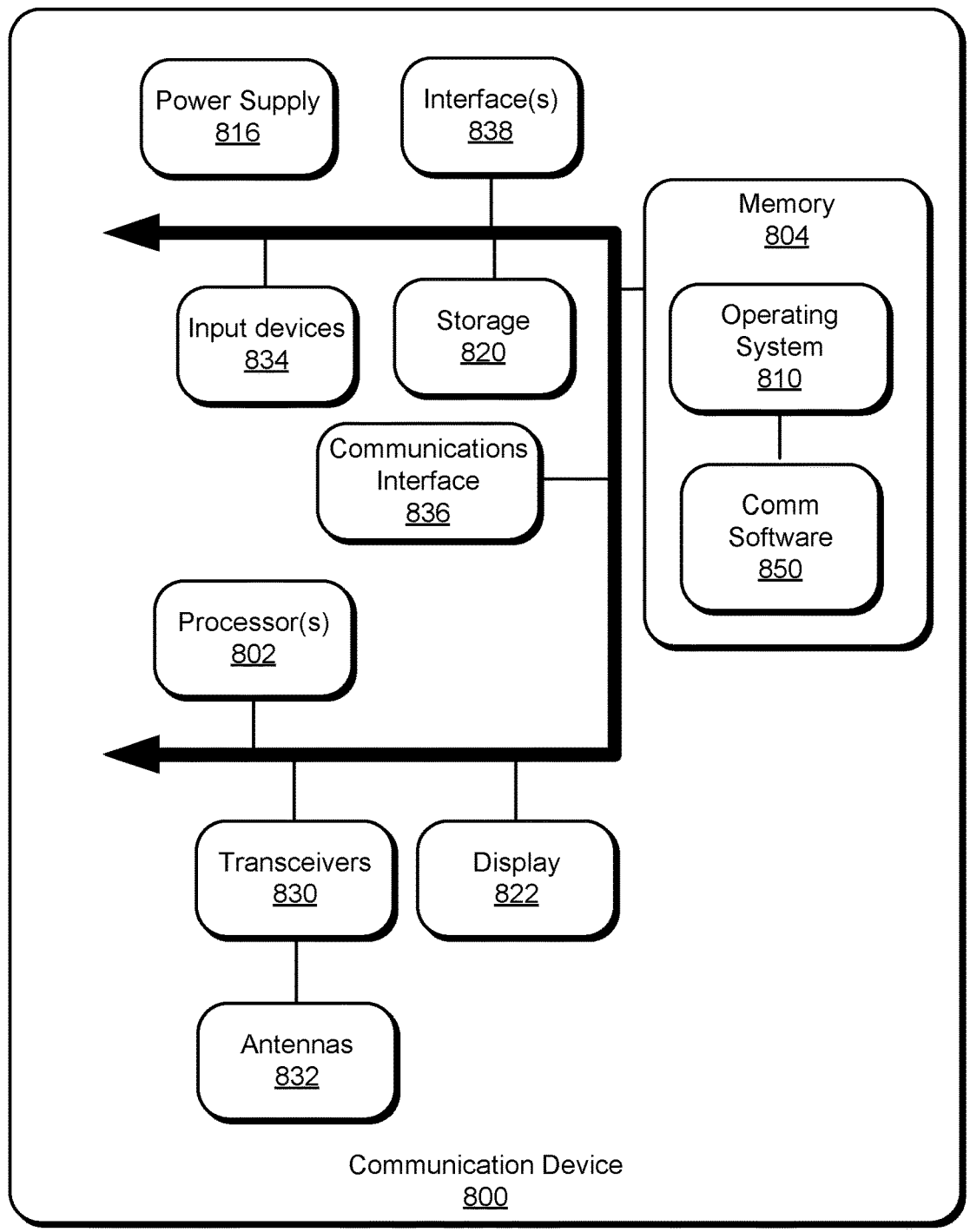
FIG. 8 illustrates an example communication device for implementing the features and operations of the described technology.

FIG. 8 illustrates an example communication device 800 for implementing the features and operations of the described technology. The communication device 800 is an example charging receiver device and may be a client device, such as a laptop, mobile device, desktop, tablet; a server/cloud device; internet-of-things device; an electronic accessory; or other chargeable electronic devices. The communication device 800 includes one or more processor(s) 802 and a memory 804. The memory 804 generally includes both volatile memory (e.g., RAM) and non-volatile memory (e.g., flash memory). An operating system 810 resides in the memory 804 and is executed by the processor(s) 802.

In an example communication device 800, as shown in FIG. 8, one or more modules or segments, such as communication software 850, application modules, and other modules, are loaded into the operating system 810 on the memory 804 and/or storage 820 and executed by processor (s) 802. The storage 820 may store communication parameters and other data and be local to the communication device 800 or may be remote and communicatively connected to the communication device 800.

The communication device 800 includes a power supply 816, which is powered by one or more batteries or other power sources and which provides power to other components of the communication device 800. The power supply 816 may also be connected to an external power source that overrides or recharges the built-in batteries or other power sources.

The communication device 800 may include one or more communication transceivers 830 which may be connected to one or more antenna(s) 832 to provide network connectivity (e.g., mobile phone network, Wi-Fi®, Bluetooth®) to one or more other servers and/or client devices (e.g., mobile devices, desktop computers, or laptop computers). The communication device 800 may further include a network adapter 836, which is a type of communication device. The communication device 800 may use the adapter and any other types of communication devices for establishing connections over a wide-area network (WAN) or local-area network (LAN). It should be appreciated that the network connections shown are exemplary and that other communication devices and means for establishing a communications link between the communication device 800 and other devices may be used.

The communication device 800 may include one or more input devices 834 such that a user may enter commands and information (e.g., a keyboard or mouse). These and other input devices may be coupled to the server by one or more interfaces 838, such as a serial port interface, parallel port, or universal serial bus (USB). The communication device 800 may further include a display 822, such as a touch screen display.

The communication device 800 may include a variety of tangible processor-readable storage media and intangible processor-readable communication signals. Tangible processor-readable storage can be embodied by any available media that can be accessed by the communication device 800 and includes both volatile and nonvolatile storage media, removable and non-removable storage media. Tangible processor-readable storage media excludes intangible communications signals and includes volatile and nonvolatile, removable and non-removable storage media implemented in any method or technology for storage of information such as processor-readable instructions, data structures, program modules or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the communication device 800. In contrast to tangible processor-readable storage media, intangible processor-readable communication signals may embody processor-readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

While this specification contains many specific implementation details, these should not be construed as limitations on the scope of any inventions or of what may be claimed, but rather as descriptions of features specific to particular embodiments of particular described technology. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

An example integrated isolating antenna array component for use in a communication device having two antennas operational within a first frequency range in the communication device is provided. The integrated isolating antenna array component includes an interconnection substrate and an antenna array adjacent to the interconnection substrate and including one or more radiating elements. The antenna array is configured to drive the one or more radiating elements within a second frequency range in the communication device. The second frequency range is higher than the first frequency range. The integrated isolating antenna array component further includes an isolator affixed to the interconnection substrate and configured to be connected to electrical ground. The isolator is configured to reduce radiofrequency coupling between the two antennas within the first frequency range.

Another example integrated isolating antenna array component of any preceding component further includes transceiver circuitry including one or more transceiver elements embedded in the interconnection substrate. Each transceiver element includes an antenna feed connected through the interconnection substrate to drive a corresponding radiating element of the antenna array.

Another example integrated isolating antenna array component of any preceding component is provided, wherein the transceiver circuitry and the interconnection substrate are positioned between the isolator and the antenna array.

Another example integrated isolating antenna array component of any preceding component is provided, wherein the interconnection substrate is a first interconnection substrate, the antenna array is a first antenna array, and the transceiver circuitry is first transceiver circuitry, The example integrated isolating antenna array component further includes a second interconnection substrate, a second antenna array including one or more radiating elements, second transceiver circuitry including one or more transceiver elements embedded in the interconnection substrate, wherein the second interconnection substrate, the second antenna array, and the second transceiver circuitry are positioned on the opposite side of the isolator from the first interconnection substrate, the first antenna array, and the first transceiver circuitry.

Another example integrated isolating antenna array component of any preceding component is provided, wherein the interconnection substrate is a first interconnection substrate and the antenna array is a first antenna array. The example integrated isolating antenna array component further includes a second interconnection substrate and a second antenna array including one or more radiating elements, wherein the second interconnection substrate and the second antenna array are positioned on the opposite side of the isolator from the first interconnection substrate and the first antenna array.

Another example integrated isolating antenna array component of any preceding component is provided, wherein radiating elements of the antenna array are formed as slot antennas in the isolator.

Another example integrated isolating antenna array component of any preceding component is provided, wherein the radiating elements of the antenna array include dipole antennas.

Another example integrated isolating antenna array component of any preceding component is provided, wherein the radiating elements of the antenna array include slot antennas.

Another example integrated isolating antenna array component of any preceding component is provided, wherein the radiating elements of the antenna array include patch antennas.

An example communication device includes two antennas operational within a first frequency range in the communication device, and an integrated isolating antenna array component and positioned between the two antennas in the communication device to reduce radiofrequency coupling between the two antennas. The integrated isolating antenna array component includes an interconnection substrate, and an antenna array adjacent to the interconnection substrate and including one or more radiating elements. The antenna array is configured to drive the one or more radiating elements within a second frequency range in the communication device. The second frequency range is higher than the first frequency range. The integrated isolating antenna array component further includes an isolator affixed to the interconnection substrate and configured to be connected to electrical ground. The isolator is configured to reduce the radiofrequency coupling between the two antennas within the first frequency range.

Another example communication device of any preceding communications device further includes transceiver circuitry including one or more transceiver elements embedded in the interconnection substrate. Each transceiver element includes an antenna feed connected through the interconnection substrate to drive a corresponding radiating element of the antenna array.

Another example communication device of any preceding communications device is provided, wherein the transceiver circuitry and the interconnection substrate are positioned between the isolator and the antenna array.

Another example communication device of any preceding communications device is provided, wherein the interconnection substrate is a first interconnection substrate, the antenna array is a first antenna array, and the transceiver circuitry is first transceiver circuitry. The example communication device further includes a second interconnection substrate, a second antenna array including one or more radiating elements, and second transceiver circuitry including one or more transceiver elements embedded in the interconnection substrate, wherein the second interconnection substrate, the second antenna array, and the second transceiver circuitry are positioned on the opposite side of the isolator from the first interconnection substrate, the first antenna array, and the first transceiver circuitry.

Another example communication device of any preceding communications device is provided, wherein the interconnection substrate is a first interconnection substrate, and the antenna array is a first antenna array. The example communication device further includes a second interconnection substrate and a second antenna array including one or more radiating elements, wherein the second interconnection substrate and the second antenna array are positioned on the opposite side of the isolator from the first interconnection substrate and the first antenna array.

Another example communication device of any preceding communications device is provided, wherein radiating elements of the antenna array are formed as slot antennas in the isolator.

Another example communication device of any preceding communications device is provided, wherein the radiating elements of the antenna array include dipole antennas.

Another example communication device of any preceding communications device is provided, wherein the radiating elements of the antenna array include slot antennas.

Another example communication device of any preceding communications device is provided, wherein the radiating elements of the antenna array include patch antennas.

An example method includes driving two antennas to radiate within a first frequency range in a communication device, reducing radiofrequency coupling between the two driven antennas within the first frequency range using an isolator affixed to an interconnection substrate of an integrated isolating antenna array component and connected to electrical ground of the communication device, and driving one or more radiating elements of an antenna array of the integrated isolating antenna array component to radiate within a second frequency range in the communication device/The second frequency range is higher than the first frequency range.

Another example method of any preceding method is provided, wherein the one or more radiating elements of the antenna array are formed as slot antennas in the isolator.

An example system includes means for driving two antennas to radiate within a first frequency range in a communication device, means for reducing radiofrequency coupling between the two driven antennas within the first frequency range affixed to an interconnection substrate of an integrated isolating antenna array component and connected to electrical ground of the communication device, and means for driving one or more radiating elements of an antenna array of the integrated isolating antenna array component to radiate within a second frequency range in the communication device. The second frequency range is higher than the first frequency range.

Another example system of any preceding system is provided, wherein the one or more radiating elements of the antenna array are formed as slot antennas in the means for reducing.

A number of implementations of the described technology have been described. Nevertheless, it will be understood that various modifications can be made without departing from the spirit and scope of the recited claims.

What is claimed is:

1. An integrated isolating antenna array component for use in a communication device having two antennas operational within a first frequency range, the two antennas being positioned in the communication device, the integrated isolating antenna array component comprising:
    an interconnection substrate;
    an antenna array adjacent to the interconnection substrate and including one or more radiating elements;
    transceiver circuitry configured to drive the one or more radiating elements within a second frequency range, the second frequency range being higher than the first frequency range; and
    an isolator affixed to the interconnection substrate and configured to be connected to electrical ground, the isolator being configured by a positioning of the isolator between the two antennas to reduce radiofrequency coupling between the two antennas within the first frequency range,
    wherein the transceiver circuitry is positioned in the interconnection substrate between the antenna array and the isolator and the transceiver circuitry is electronically coupled with the one or more radiating elements in the interconnection substrate.

2. The integrated isolating antenna array component of claim 1, wherein the transceiver circuitry includes one or more transceiver elements embedded in the interconnection substrate, each transceiver element including an antenna feed connected through the interconnection substrate to drive a corresponding radiating element of the antenna array.

3. The integrated isolating antenna array component of claim 2, wherein the transceiver circuitry and the interconnection substrate are positioned between the isolator and the antenna array.

4. The integrated isolating antenna array component of claim 2, wherein the interconnection substrate is a first interconnection substrate, the antenna array is a first antenna array, and the transceiver circuitry is first transceiver circuitry, and further comprising:
    a second interconnection substrate;
    a second antenna array including one or more radiating elements; and
    second transceiver circuitry including one or more transceiver elements embedded in the interconnection substrate, wherein the second interconnection substrate, the second antenna array, and the second transceiver circuitry are positioned on the opposite side of the isolator from the first interconnection substrate, the first antenna array, and the first transceiver circuitry.

5. The integrated isolating antenna array component of claim 1, wherein the interconnection substrate is a first interconnection substrate and the antenna array is a first antenna array, and further comprising:
    a second interconnection substrate; and
    a second antenna array including one or more radiating elements, wherein the second interconnection substrate and the second antenna array are positioned on the opposite side of the isolator from the first interconnection substrate and the first antenna array.

6. The integrated isolating antenna array component of claim 1, wherein at least one of the one or more radiating elements of the antenna array are formed as slot antennas in the isolator.

7. The integrated isolating antenna array component of claim 1, wherein at least one of the one or more radiating elements of the antenna array include dipole antennas.

8. The integrated isolating antenna array component of claim 1, wherein at least one of the one or more radiating elements of the antenna array include slot antennas.

9. The integrated isolating antenna array component of claim 1, wherein at least one of the one or more radiating elements of the antenna array include patch antennas.

10. A communication device comprising:
    two antennas operational within a first frequency range, the two antennas being positioned in the communication device; and
    an integrated isolating antenna array component positioned between the two antennas in the communication device to reduce radiofrequency coupling between the two antennas, the integrated isolating antenna array component including
    an interconnection substrate;
    an antenna array adjacent to the interconnection substrate and including one or more radiating elements;
    transceiver circuitry configured to drive the one or more radiating elements within a second frequency range, the second frequency range being higher than the first frequency range; and an isolator affixed to the interconnection substrate and configured to be connected to electrical ground, the isolator being configured to reduce the radiofrequency coupling between the two antennas within the first frequency range, wherein transceiver circuitry is positioned in the interconnection substrate between the antenna array and the isolator and the transceiver circuitry is electronically coupled with the one or more radiating elements in the interconnection substrate.

11. The communication device of claim 10, wherein the transceiver circuitry includes one or more transceiver elements embedded in the interconnection substrate, each transceiver element including an antenna feed connected through the interconnection substrate to drive a corresponding radiating element of the antenna array.

12. The communication device of claim 11, wherein the transceiver circuitry and the interconnection substrate are positioned between the isolator and the antenna array.

13. The communication device of claim 11, wherein the interconnection substrate is a first interconnection substrate, the antenna array is a first antenna array, and the transceiver circuitry is first transceiver circuitry, and further comprising:
a second interconnection substrate;
a second antenna array including one or more radiating elements; and
second transceiver circuitry including one or more transceiver elements embedded in the interconnection substrate, wherein the second interconnection substrate, the second antenna array, and the second transceiver circuitry are positioned on the opposite side of the isolator from the first interconnection substrate, the first antenna array, and the first transceiver circuitry.

14. The communication device of claim 10, wherein the interconnection substrate is a first interconnection substrate and the antenna array is a first antenna array, and further comprising:
a second interconnection substrate; and
a second antenna array including one or more radiating elements, wherein the second interconnection substrate and the second antenna array are positioned on the opposite side of the isolator from the first interconnection substrate and the first antenna array.

15. The communication device of claim 10, wherein at least one of the one or more radiating elements of the antenna array are formed as slot antennas in the isolator.

16. The communication device of claim 10, wherein at least one of the one or more radiating elements of the antenna array include dipole antennas.

17. The communication device of claim 10, wherein at least one of the one or more radiating elements of the antenna array include slot antennas.

18. The communication device of claim 10, wherein at least one of the one or more radiating elements of the antenna array include patch antennas.

19. A method comprising:
driving two antennas to radiate within a first frequency range, the two antennas being positioned in a communication device;
reducing radiofrequency coupling between the two driven antennas within the first frequency range using an isolator affixed to an interconnection substrate of an integrated isolating antenna array component and connected to electrical ground of the communication device, the integrated isolating antenna array component positioned between the two antennas; and
driving one or more radiating elements of an antenna array of the integrated isolating antenna array component by a transceiver positioned in the interconnection substrate between the isolator and the antenna array, the transceiver electronically coupled to the one or more radiating elements in the interconnection substrate.

20. The method of claim 19, wherein the one or more radiating elements of the antenna array are formed as slot antennas in the isolator.

* * * * *